United States Patent [19]

Mano et al.

[11] Patent Number: 5,736,751
[45] Date of Patent: *Apr. 7, 1998

[54] FIELD EFFECT TRANSISTOR HAVING THICK SOURCE AND DRAIN REGIONS

[75] Inventors: Toshihiko Mano; Toshimoto Kodaira; Hiroyuki Oshima, all of Nagan-ken, Japan

[73] Assignee: Seiko Epson Corporation, Tokyo, Japan

[*] Notice: The term of this patent shall not extend beyond the expiration date of Pat. No. 5,124,768.

[21] Appl. No.: 413,369

[22] Filed: Mar. 30, 1995

Related U.S. Application Data

[63] Continuation of Ser. No. 320,729, Oct. 11, 1994, which is a continuation of Ser. No. 901,432, Jun. 19, 1992, abandoned, which is a continuation-in-part of Ser. No. 203,548, May 31, 1988, Pat. No. 5,124,768, which is a continuation of Ser. No. 862,151, May 12, 1986, abandoned, which is a continuation of Ser. No. 484,046, Apr. 11, 1983, abandoned.

[30] Foreign Application Priority Data

| Apr. 13, 1982 | [JP] | Japan | 57-61440 |
| Apr. 19, 1982 | [JP] | Japan | 57-64892 |
| Aug. 19, 1982 | [JP] | Japan | 57-143786 |

[51] Int. Cl.$^6$ ................................................. H01L 29/76
[52] U.S. Cl. ............................ 257/66; 257/72; 257/347; 257/390
[58] Field of Search ........................ 257/49, 66, 72, 257/347, 390

[56] References Cited

U.S. PATENT DOCUMENTS

| 3,258,663 | 6/1966 | Weimer . |
| 3,513,042 | 5/1970 | Hagon .................... 357/23.7 |
| 4,119,992 | 10/1978 | Ipri et al. . |
| 4,177,473 | 12/1979 | Ovshinsky . |
| 4,182,965 | 1/1980 | Pfleiderer . |
| 4,199,384 | 4/1980 | Hsu . |
| 4,431,271 | 2/1984 | Okubo . |
| 4,442,448 | 4/1984 | Shimbo . |
| 4,455,495 | 6/1984 | Masuhara et al. . |
| 4,582,395 | 4/1986 | Morozumi ................... 350/334 |
| 4,623,908 | 11/1986 | Oshima et al. ................ 257/66 |

FOREIGN PATENT DOCUMENTS

| 51396 | 12/1982 | European Pat. Off. . |
| 3130407 | 7/1988 | Germany . |
| 50-8483 | 1/1975 | Japan . |
| 55-98868 | 7/1980 | Japan . |
| 57-132191 | 2/1981 | Japan . |
| 57-10266 | 1/1982 | Japan . |
| 57-61440 | 1/1982 | Japan . |
| 56-135968 | 10/1991 | Japan . |
| 1178869 | 7/1967 | United Kingdom . |
| 1267975 | 3/1972 | United Kingdom . |
| 1358416 | 7/1974 | United Kingdom . |
| 2067353 | 12/1980 | United Kingdom . |
| 2067353 | 7/1981 | United Kingdom . |
| 2105905 | 7/1981 | United Kingdom . |
| 2081018 | 2/1982 | United Kingdom . |
| 2070857 | 9/1987 | United Kingdom . |

OTHER PUBLICATIONS

S.M. Sze, *Semiconductor Device Physics and Technology*, John Wiley & Sons, New York (1985) pp. 343–344.
Full English Translation of Aeejoshi et al., Japan Kokai 55–98868 (Aug. 1980).
"Controlling Polysilicon TFT Characteristics," *Oyo Denshi Bussei Bunkakai Kenkyu Hoku*, No. 427, pp. 25–30 (1989).

(List continued on next page.)

Primary Examiner—J. Carroll
Attorney, Agent, or Firm—Oliff & Berridge

[57] ABSTRACT

Thin film transistor including polycrystalline silicon or amorphous silicon thin film channel regions having a thickness of between about 100 Å and 2500 Å which are thinner than at least a portion of the source and drain regions and active matrix assemblies including thin film transistors for improved electro-optical displays are provided.

8 Claims, 8 Drawing Sheets

OTHER PUBLICATIONS

Thomas W. Little, et al., "Low Temperature Poly-Si TFTs Using Solid Phase Crystallization of Very Thin Films and an Electron Cyclotron Resonance Chemical Vapor Deposition Gate Insulator," *Japanese Journal of Applied Physics*, V. 30, No. 138, Dec. 1991, pp. 3724–3728.

Hiroyuki Oshima, et al., "Future Trends for TFT Integrated Circuits on Glass Substrates," IEEE 1989, pp. IEDM 89157–160.

Anthony Juliana, et al., "Thin–Film Polysilicon Devices for Flat-Panel Display Circuitry," SID International Symposium Digest of Technical Papers, May 1982, pp. 38–39.

Shinji Morozumi, "Active Matrix Addressed Liquid–Crystal Displays," 1985 International Display Conference, 1985, IEEE, pp. 9–13.

N. Sasaki, et al., "Effect of Silicon Film Thickness on Threshold Voltage of SOS–MOSFETs," *Solid State Electronics*, V. 22, No. 4–E, pp. 417–421.

S. Chapman, et al., "Polysilicon Switches for Display Devices," IBM Technical Disclosure Bulletin, V. 23, No. 1, Jun. 1980, pp. 351–352.

M. Matsui, et al., "Polycrystalline–Silicon Thin Film Transistors on Glass," *Appl. Phys Lett.* 37 (10), Nov. 15, 1980, pp. 936–937.

THICKNESS OF
i-POLYSILICON LAYER
(CHANNEL REGION)

● = $I_{ON}$
○ = $I_{OFF}$
(LEAKAGE CURRENT)

FIELD EFFECT TRANSISTOR HAVING THICK SOURCE AND DRAIN REGIONS

CROSS-REFERENCE TO RELATED APPLICATIONS

This is a Continuation of application Ser. No. 08/320,729 filed Oct. 11, 1994, now pending, which in turn is a Continuation of application Ser. No. 07/901,432 filed Jun. 19, 1992, abandoned, which is a Continuation-in-part of U.S. Ser. No. 07/203,548, filed May 31, 1988, U.S. Pat. No. 5,124,768, which is a continuation of U.S. Ser. No. 06/862,151, filed May 12, 1986, abandoned, which is a continuation of U.S. Ser. No. 06/484,046, filed Apr. 11, 1983, abandoned.

BACKGROUND OF THE INVENTION

This invention relates generally to thin film transistors, active matrix assemblies including thin film transistors, and more particularly to improved thin film transistors including polycrystalline silicon or amorphous silicon thin films and active matrix assemblies including the thin film transistors for providing improved thin-type displays.

Applications of thin film transistor technology are widespread, including their use as active switching elements in thin matrix panels and three-dimensional integrated circuits and the like. A recurring problem encountered when using thin film transistors is leakage current of the transistor when it is in the OFF state. In the conventional MOS type transistor utilizing monocrystalline silicon, a PN junction is utilized to decrease OFF current where a P-type substrate is used for N-channel and N-type substrate is used for P-channel. When using prior art polycrystalline silicon transistors, the formation of an effective PN junction cannot be attained and hence the OFF current cannot be decreased enough to allow its use in a matrix display. This problem is particularly undesirable when the transistor is being used as a switching element in, for example, an active matrix panel. A MOS transistor with a poly-crystalline-silicon film channel region of approximately 2 microns thickness is disclosed in Solid-State Electronics, 1972, Vol. 15, pp. 789–799. The authors reported on field-effects in polycrystalline-silicon films and threshold voltages of doped films and concluded that these MOS transistors would find limited practical application.

When a thin film transistor (TFT) is used as a switching element in a matrix-type arrangement in a liquid crystal display (LCD) device it selects the data signal to be applied to the liquid crystal material. In such construction, the TFT must have the following characteristics:

(1) Permit enough current to flow into a condenser for charging when the TFT is in the ON state;

(2) Exhibit insignificant current flow in an electrode when the TFT is in the OFF state; and (3) Show stabilized, reproducible performance and reliability.

Requirement (1) relates to the TFT's inputting a data signal into a condenser. A TFT must accept a large amount of current flow for a short time so as to completely input the data signal to the condenser, since the quality of a liquid crystal display depends in part on the capacitance of the condenser. This amount of current flow (hereinafter referred to as "ON current") is determined by the capacitance of the condenser and the time elapsed in writing the data signal to the condenser. Compliance with condition (1) depends largely on the TFT's size (especially channel length and width), construction, manufacturing process and input voltage to its gate. A TFT composed of polycrystalline silicon is capable of carrying a sufficient amount of ON current, and satisfying the requirement (1), since the polycrystalline silicon has a large carrier mobility comparing with that of amorphous semiconductors.

Requirement (2) relates to the holding time of written data in a condenser. Generally, written data in a condenser must be kept for an extremely long time compared with the writing time of that data to the condenser. Since the capacitance of the condenser is generally a very small value, such as 1 pF, if there is even a small amount of leakage current ("OFF current") at the TFT, during the OFF state, then the driving voltage of the electrode sharply drops to the level of voltage of the data signal time. As a result, the written data signal cannot be held properly at a condenser during the OFF state, and image sharpness is lost. This problem has been especially so in the case of prior art polycrystalline silicon TFTs, where deep and shallow trap levels are unevenly distributed in a crystal grain, allowing leakage current to flow via these trap levels, as discussed in the above-identified article in Solid State Electronics.

The requirement for insignificant current flow in the OFF state is necessary in other applications of TFTs, for example, in logic circuits using TFTs where stationary current increases and in memory circuits using TFTs.

Requirement (3) relates to stability, reproducibility and reliability of thin film transistor characteristics. Generally, several tens of thousands of thin film transistors are formed on one active matrix substrate and all of them must have uniform characteristics and superior reproducibility with no dispersion among manufacturing lots and remain stable and delivery reliable performance for an indefinitely long term.

Conventional thin film transistors as active elements on a substrate include a compound semiconductor, such as calcium selenium, and the like, or non-crystalline semiconductor, such as amorphous silicon, and the like, as the semiconductor thin film. However, these TFTs cannot satisfy all of the three above-mentioned requirements. For example, a TFT including a semiconductor film satisfies requirement (1) due to the high value of carrier mobility, but cannot meet requirements (2) and (3), since this type of semiconductor exhibits poor stability and reproducibility. A non-crystalline semiconductor has a low carrier mobility, and hence substantially small ON current flows. As noted above, an active matrix panel utilizing such a thin film transistor on a substrate did not exhibit sufficiently good characteristics for providing satisfactory image quality of the above matrix panel.

Accordingly, it is desirable to provide improved thin film transistors having reduced leakage current in the OFF state that overcome deficiencies found in the prior art.

SUMMARY OF THE INVENTION

Generally speaking, in accordance with the invention, thin film transistors of a thin film thickness less than 2500 Å and greater than about 100 Å having reduced leakage current in the OFF state are provided. The thickness of the thin film in the channel region is less than the thickness of the source and drain regions. The channel thickness should also be greater than about 100 Å. When such thin film transistors are utilized in matrix display elements, the data signal line and driving electrodes may be formed with the same transparent conductive film. Thin film transistors are prepared in accordance with the invention by depositing a thin film on an insulating substrate and etching to provide a channel portion having a concave surface. The non-etched portions can be doped to provide source and drain regions. This method allows for secure connection of the connector metal to the source and drain regions without their breaking through the diffusion regions.

Accordingly, it is an object of this invention to provide an improved thin film transistor.

Another object of the invention to provide an improved thin film transistor including a silicon thin film exhibiting reduced current leakage.

A further object of the invention to provide an improved thin film transistor including a silicon thin film between about 100 Å and 2500 Å thick.

Still another object of the invention is to provide an improved thin film transistor including a channel region having a depth of at least about 100 Å and no more than about 2500 Å.

Still a further object of the invention is to provide an improved active matrix assembly including the improved thin film transistor in accordance with the invention as switching elements.

Yet another object of the invention is to provide an active matrix assembly including the film transistors as switching elements having a channel region with a thickness of at least about 100 Å and no more than about 2500 Å.

Yet a further object of the invention is to provide a process for preparing improved thin film transistors.

Another object of the invention is to provide a process for preparing improved active matrix-type arrangements including thin film transistors as switching elements.

A further object of the invention is to provide an active matrix arrangement in which the thin film transistor switching element is provided with a data signal line and driving electrodes of the same transparent conductive film.

Still other objects and advantages of the invention will in part be obvious and will in part be apparent from the specification.

The invention accordingly comprises the features of construction, combinations of elements, and arrangements of parts and the relation of one or more which will be exemplified in the steps of construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 4b is a schematic representation of a liquid crystal driving element in the matrix arrangement of FIG. 4a;

DESCRIPTION OF THE PREFERRED EMBODIMENTS

The method of manufacturing a thin film transistor (TFT), utilizing a polycrystalline silicon film is explained as follows.

Figure 1A:
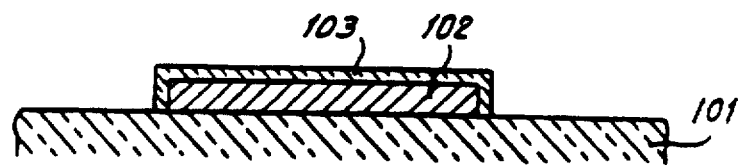
FIGS. 1a–d are cross-sectional views illustrating the processing steps for forming a thin film transistor according to an embodiment of the invention.

Referring to FIG. 1a, a thin film of polycrystalline silicon is formed on a conventional insulating substrate 101 and patterned to provide a polycrystalline island 102. A gate insulating film 103 is then formed on island 102 by thermally oxidizing island 102 or, alternatively, by chemical vapor deposition.

Figure 1B:
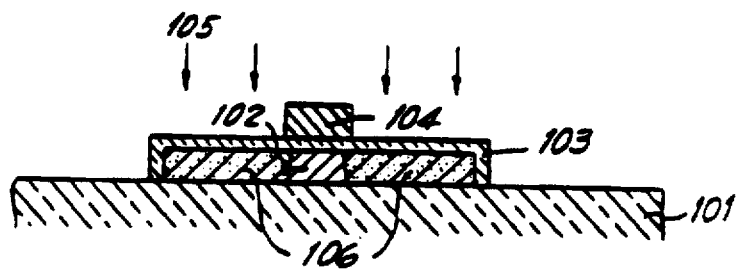

Subsequently, a second thin layer of polycrystalline silicon, metal silicofluoride, or metal is deposited and patterned to provide a gate electrode 104, as shown in FIG. 1b. Ion implanted impurities 105, such as phosphorus, arsenic or boron, are diffused into island 102 by using gate electrode 104 as a mask to form source and drain regions 106 of the transistor. An insulating layer 107 is then formed across substrate 101 and island 102.

Figure 1C:
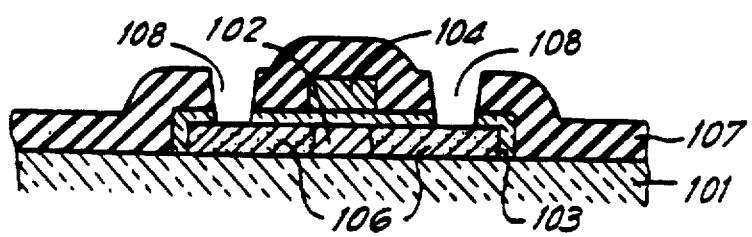
Figure 1D:
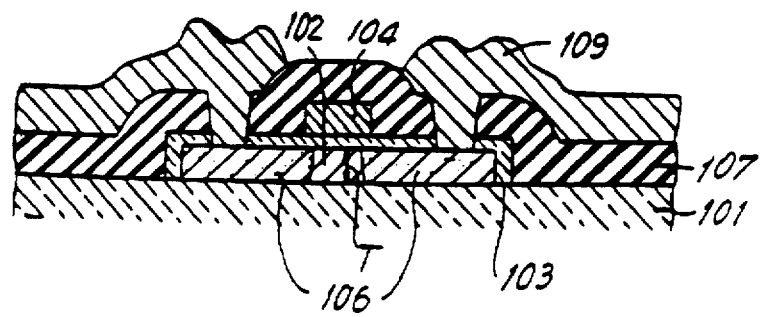

Referring to FIG. 1c, contact windows 108 are then opened in insulating layer 107 above source and drain regions 106. Finally, an electrical connector 109 is formed of, for example, aluminum and the like, as shown in FIG. 1d for providing electrical connections to the TFT.

Figure 2:
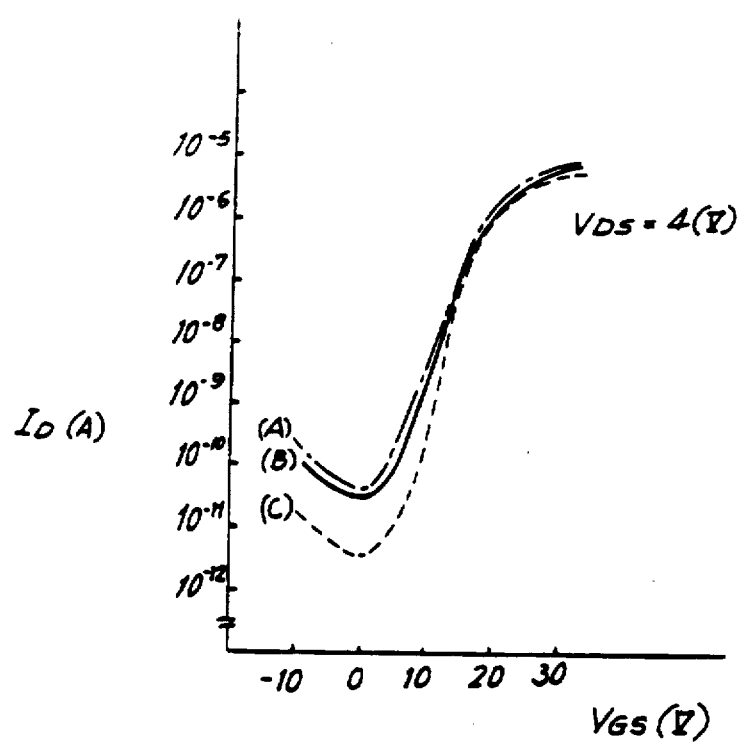
FIG. 2 is a graph illustrating physical properties of thin film transistors having varying thickness of silicon thin film.
Figure 3:
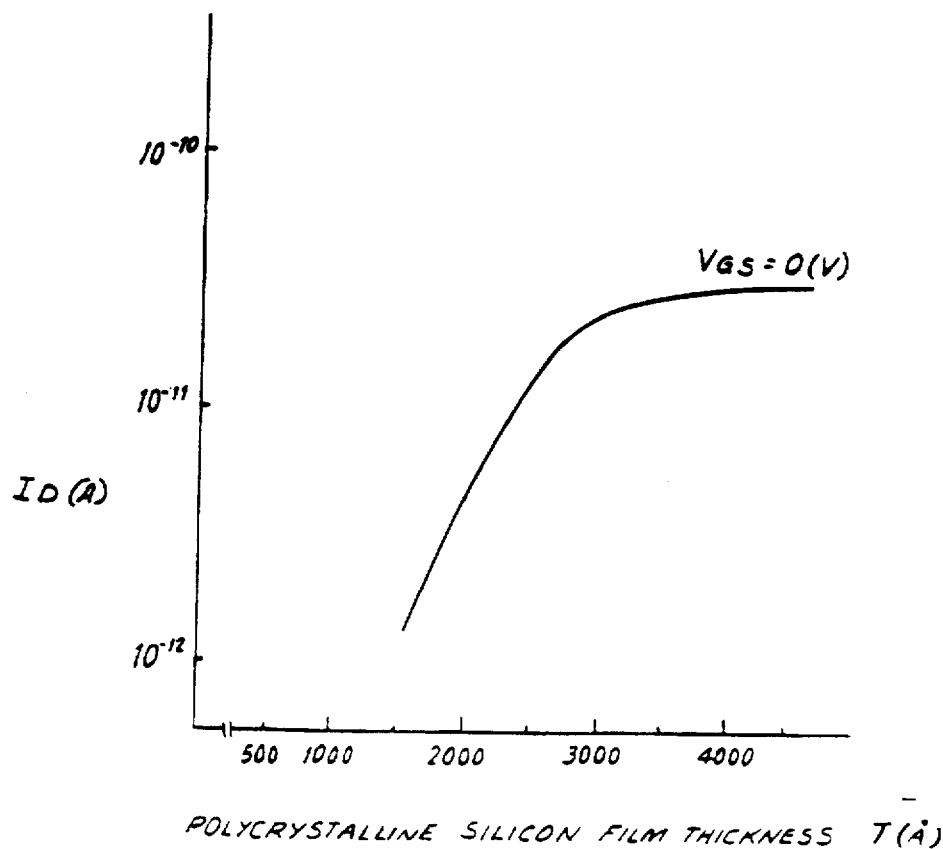
FIG. 3 is a graph illustrating the relationship between the thickness T of polycrystalline silicon and the drain current $I_D$ at zero voltage for thin film transistors.

FIGS. 2 and 3 show drain current characteristics of a TFT manufactured by the above-mentioned process. In FIG. 2, the abscissa represents the gate voltage, VGS and the ordinate represents the drain current, ID. Voltage of drain to source, VDS, was set at 4V. The three ID-VGS curves correspond to three different thicknesses of polycrystalline silicon ("T" in FIG. 1d); the thickness T of the TFT which corresponds to curve (A) is 4000 Å, the thickness T, for curve (B) is 3000 Å, and the thickness T for curve (C) is 2000 Å.

FIG. 3 shows the relationship between the thickness T of polycrystalline silicon thin film and the drain current ID in the case of null (0) gate voltage VGS (OFF state). It can be seen that below a thickness of about 2500 Å the drain current drops off markedly. The results of FIGS. 2 and 3 confirm our discovery that the leakage current of the transistor in the OFF state is dependent on the thickness T of polycrystalline film 102. At the lesser thicknesses there is a smaller leakage current. Additionally, as shown in FIG. 3, leakage current ID at VGS=0 is substantially constant for the range of thickness T greater than 2500 Å and sharply decreases when thickness T is reduced to less than 2500 Å. This reduction in leakage current has been observed in the case of other silicon thin films, such as amorphous silicon, and the like.

Based on this, the thickness T of polycrystalline silicon 102 must be controlled below the approximate value of about 2500 Å. This permits limiting the leakage current to a minimum when the transistor is in the OFF state and makes such a polycrystalline silicon TFT particularly well suited as a switching element. It is a significant embodiment of the invention to use this polycrystalline silicon TFT as a switching element in a liquid crystal active matrix panel as will be described in detail below.

A liquid crystal panel in accordance with the invention including picture elements of 0.01 mm$^2$, to 0.09 mm$^2$, wherein the resistance of the liquid crystal is about $10^{10}\Omega$. Since the leakage current of the TFT should be less than $\frac{1}{10}$ that of a liquid crystal at equivalent resistance, the leakage current should be less than $10^{-11}$ A. This will prevent adverse effects on the liquid crystal image. It is seen from FIG. 3 that the thickness T of polycrystalline silicon must be maintained at a value under about 2500 Å in order to maintain the leakage current under $10^{-11}$ A.

A primary object of the invention is to provide a thin film transistor including a non-monocrystalline silicon layer such as a polycrystalline silicon or amorphous silicon thin film having improved characteristics. It is also an important object to provide a TFT wherein the ON/OFF ratio is extremely high and the leakage current is reduced by controlling the thickness of the thin film to be less than 2500 Å. A switching element formed of such a TFT can be utilized in an active matrix display in order to improve the image quality of the display. A detailed description of such an embodiment in accordance with the invention is as follows.

A liquid crystal display device utilizing a TFT as a switching element generally includes a glass substrate at the upper or viewing side, and an opposed substrate on which the TFTs are mounted with a liquid crystal material encapsulated therebetween. The liquid crystal driving elements are formed and arranged in a matrix format on one of the substrates and some of these elements are selected by the external selecting circuits. Thus, a wide variety of characters, graphic patterns and images can be displayed on the liquid crystal panel.

Figure 4A:
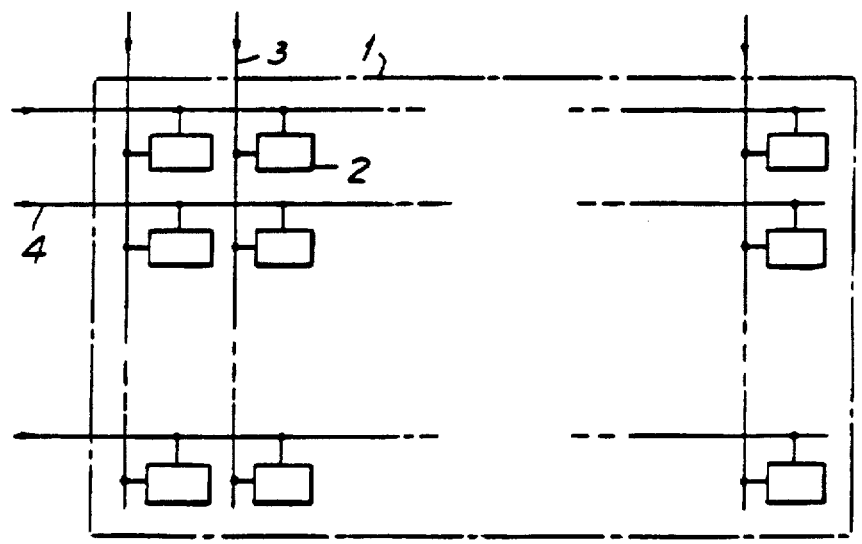
FIG. 4a is a schematic diagram of a matrix display arrangement of liquid crystal driving elements on a substrate.
Figure 4B:
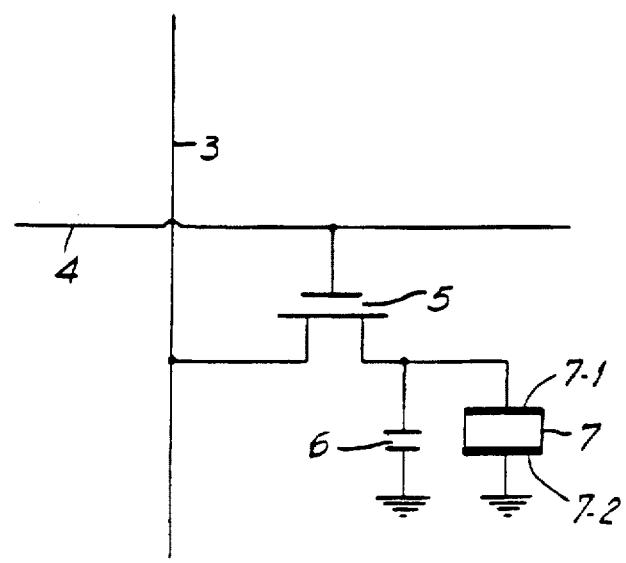
Figure 5A:
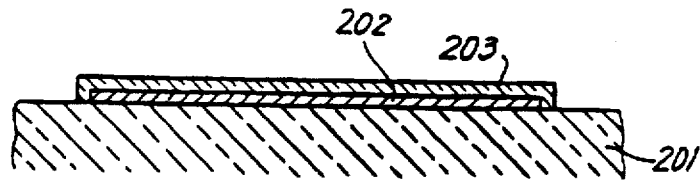
FIGS. 5a–5d are cross-sectional views of the processing steps for thin film transistors according to the invention.
Figure 5B:
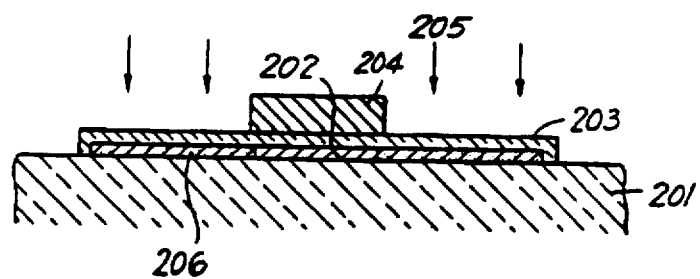
Figure 5C:
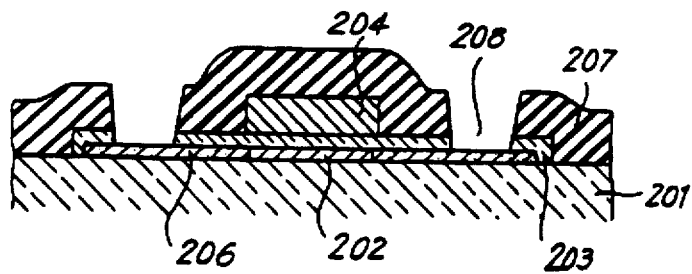
Figure 5D:
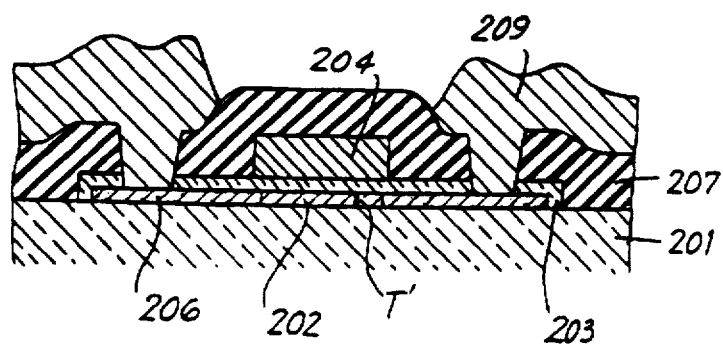

FIGS. 4a and 4b show in general a diagram of a liquid crystal display device. FIG. 4a represents a matrix-type arrangement of liquid crystal driving elements formed on a substrate. A display region is surrounded by boundary lines 1 wherein a plurality of liquid crystal driving elements 2 are arranged in a matrix format. A data signal line 3 and a timing signal line 4 are connected to each liquid crystal driving element 2.

FIG. 4b represents the detailed construction of liquid crystal driving element 2. Each liquid crystal cell 7 includes a liquid crystal driving electrode 7-1 corresponding to a liquid crystal driving element and an opposed electrode 7-2 mounted on the upper substrate. TFT 5 controls the input of the data signal to a liquid crystal driving electrode. Condenser 6 is used for holding data signals. In this arrangement, TFTs of the liquid crystal driving element are used as switching elements which select a data signal to apply to the liquid crystal.

The performance of an active matrix panel is affected by the characteristics of the TFTs of the panel as described above. In order to be effective, a TFT in an active matrix panel must:

(1) allow enough current to flow into condenser 6 for charging when TFT 5 is ON;

(2) permit only insignificant leakage current when TFT 5 is in an OFF state; and (3) show stabilized, reproducible performance and reliability.

FIGS. 5a–5d show the steps in the manufacture of a preferred TFT according to an embodiment of the invention. The manufacturing method is similar to that described in FIG. 1. The reference numerals shown in FIG. 5 correspond generally to those shown in FIG. 1 as follows: (101–201, 102–202 . . . 109–209). In this embodiment, thin film silicon 202 has a thickness less than 2500 Å as shown as T' and provides an improved TFT due to thickness T'. As discussed above, the film thickness T' of polycrystalline silicon film 202 is less than 2500 Å, thereby providing a product having minimal leakage current in the OFF state, characteristic of the invention.

As mentioned above, OFF current can be reduced by decreasing film thickness T' of polycrystalline silicon 202. However, when manufacturing such a TFT with polycrystalline silicon 202 of reduce thickness, connector metal 209, such as Al or Al—Si can break through the diffusion regions 206, so that sufficient contact with the source and drain region is not possible ("breakthrough"). Consequently, control of film thickness T' of a polycrystalline silicon layer 202 (decreasing OFF current) is limited by the requirement that connector metal 209 make stable contact with source and drain regions 206 even though there is a possibility of further reducing the OFF current with even thinner films. This problem can be solved in accordance with a further embodiment of the invention wherein the thickness of the thin film in the channel region can be reduced without reducing unnecessarily the thickness of the source and drain regions as shown in FIG. 6. This allows the connector metal to be placed in contact with the source and drain regions while still reducing the OFF current in accordance with the primary object of the invention.

Figure 6A:
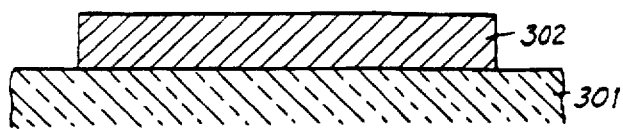
FIGS. 6a–6e are cross-sectional views of the processing steps for forming thin film transistors according to another embodiment of the invention.

This further embodiment is shown in FIGS. 6a–6e with a TFT including a polycrystalline thin film 302. Polycrystalline silicon layer 302 of sufficient thickness to prevent "breakthrough", yet having a thin film channel of no greater than 2500 Å thickness is formed in such a manner that connector metal can be precisely in contact with source and drain region is patterned to provide island 302 as shown in FIG. 6a. The thickness of thin film layer 302 is reduced to between about 100 Å and 2500 Å, preferably 100 Å to 1000 Å and 100 Å to 500 Å by etching a central channel region 302a in a concave shape. In this configuration, the source and drain are significantly thicker than the channel both near and at the junction with the channel. This leads to sufficiently low resistance values for the source and drain regions. This arrangement improves the speed of switching operations significantly compared to a construction in which the source and drain are thin at or near the channel regions while effectively limiting leakage current.

Figure 6B:
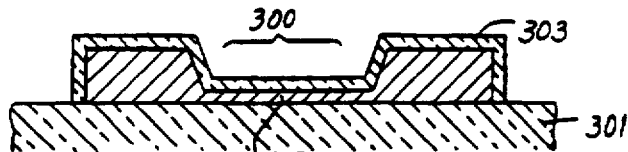
Figure 6C:
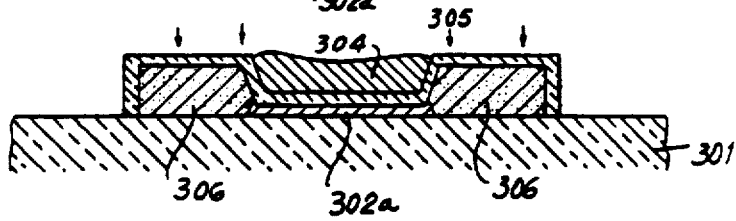
Figure 6D:
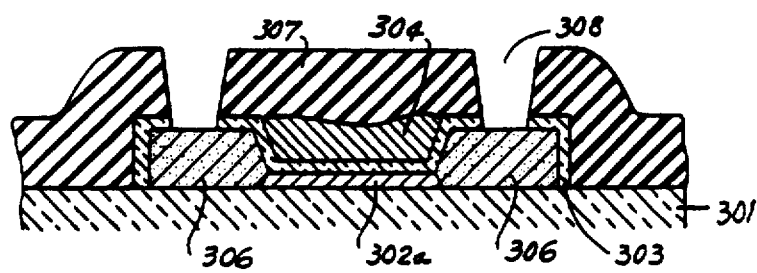
Figure 6E:
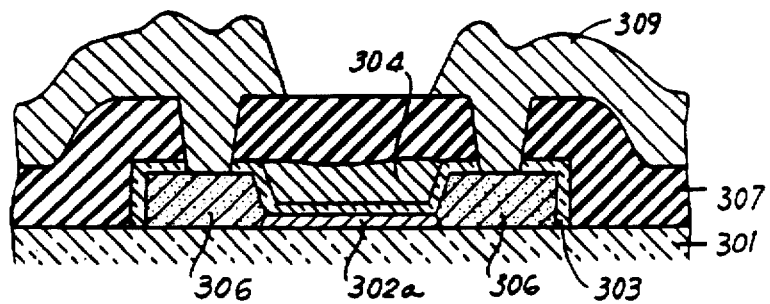

A gate insulating film 303 is formed by thermal oxidation of polycrystalline silicon 302 or by chemical vapor deposition, as shown in FIG. 6b. Subsequently, a second thin layer of polycrystalline silicon, metal silicide or metal is deposited and patterned to provide gate electrode 304. Ion implanted impurities 305, such as phosphorus, arsenic or boron, are diffused to film 302 by using gate electrode 304 as a mask to form source and drain regions 306, as shown in FIG. 6c. After that, as shown in FIG. 6d, insulating film 307 is formed and contact windows 308 are opened in order to allow a connector metal 309 of such as aluminum and the like, is deposited, to contact source and drain regions 306, as shown in FIG. 6e.

According to this construction, connector metal 309 will make perfect contact with source and drain regions 306, without breakthrough of film 302 and the leakage current can still be greatly reduced when the TFT is in the OFF state, and the thickness of the polycrystalline silicon layer, in the channel region 302 will be no more than 2500 Å. As mentioned above, a TFT prepared in accordance with the invention is superior to conventional TFTs in that leakage current can be substantially reduced during the OFF state of the TFT which is a requirement of devices, such as active matrix display devices including TFTs formed of polycrystalline silicon.

Figure 11:
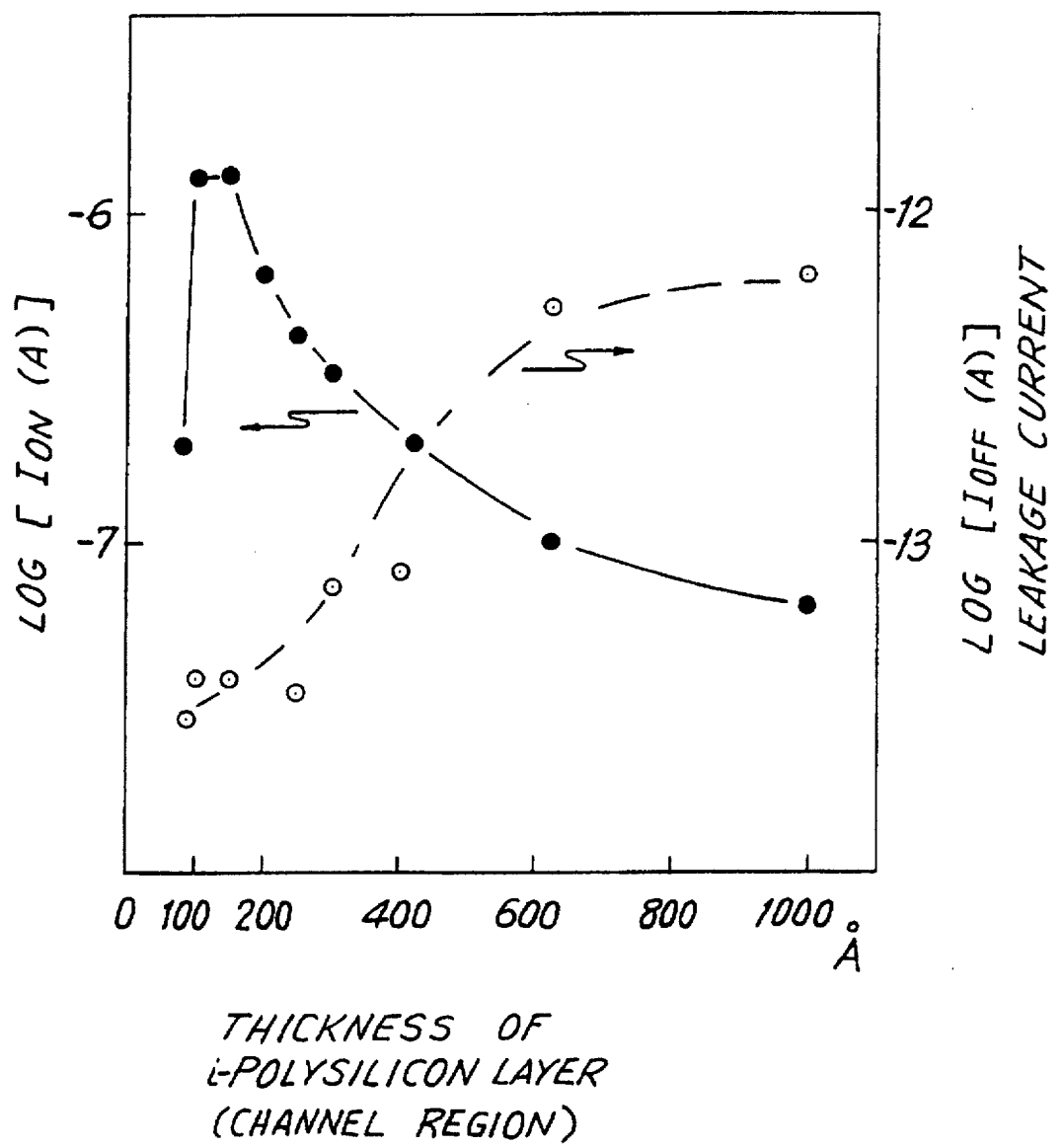
FIG. 11 is a graph comparing the change in both ON current and leakage current with the change in thickness of the channel region.

The effects of the thickness of an intrinsic polycrystalline silicon channel on leakage current and ON current were investigated. Values were determined at room temperature with:

$V_G - V_S = 20V$ (for $I_{ON}$), $-5V$ (for $I_{OFF}$)
$V_D - V_S = 4V$
sample width: 10 μm  sample length: 10 μm Data points for channel thickness and $I_{ON}$ are listed below in Table I and are also shown in FIG. 11.

TABLE I

| Channel Thickness (Å) | $I_{ON}$ (Amps) × $10^{-7}$ |
| --- | --- |
| 80 | 2 |
| 100 | 12 |
| 150 | 13 |
| 200 | 6.3 |
| 250 | 4.1 |
| 300 | 3.2 |
| 450 | 2.0 |
| 600 | 1.0 |
| 1000 | 0.63 |

FIG. 11 is a graph plotting the ON current versus the channel thickness as channel thickness is decreased from 1000 Å to about 100 Å. The graph also includes a plot of leakage current versus the same channel thickness. As shown in these results, there is an increase in ON current as the channel region becomes thinner. The leakage current also decreases. However, at about 100 Å in thickness the ON current increase not only abruptly terminates, but it begins to decrease significantly. Thus, a thickness of about 100 Å was determined as a minimum preferred channel thickness.

Figure 7:
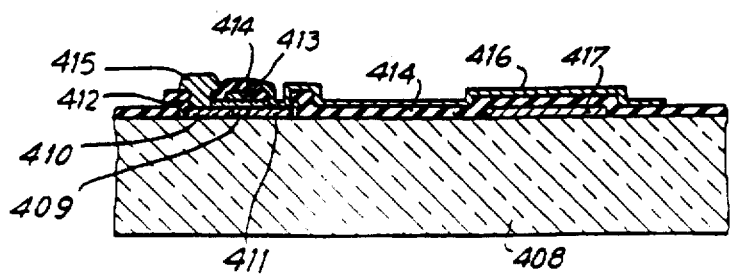
FIG. 7 is a cross-sectional view of one substrate of an active matrix panel for a liquid crystal display device including a thin film transistor constructed in accordance with an embodiment of the invention.

A further matrix in accordance with this invention is described in detail hereafter with reference to FIG. 7.

FIG. 7 represents a sectional view of an active matrix of a substrate including a TFT in accordance with an embodiment of this invention. In order to simplify the drawing, only one liquid crystal driving element is shown. A thin layer of polycrystalline silicon 409 is deposited on an insulating substrate 408, such as quartz or the like, for forming a thin film transistor and a capacitor electrode. In the thin film transistor of FIG. 7, a channel region 409 of intrinsic polycrystalline silicon is formed. A source 410 and a drain 411 are formed by doping impurities, such as phosphorus, arsenic or boron into intrinsic polycrystalline silicon 409. A gate insulating film 412 is formed by oxidizing intrinsic polycrystalline silicon 409 by thermal treatment. An address signal line of the gate electrode 413 and an insulating layer 414 deposited thereon function as the dielectric of a condenser. A data signal line 415 connects source electrode or drain electrode. A driving electrode 416 is electrically connected to the corresponding drain or source electrode. A layer 417 on substrate 408 is a common electrode of the condenser for holding the data signal.

Figure 8A:
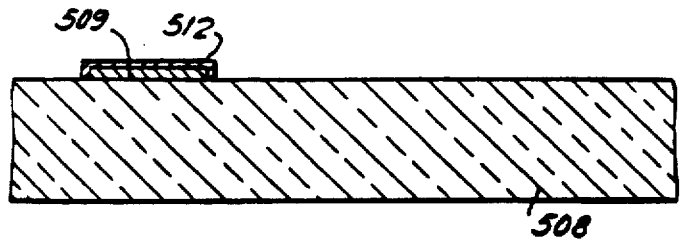
FIGS. 8a–8e are cross-sectional views of the processing steps for forming one substrate of FIG. 7 constructed according to an embodiment of the invention.
Figure 8B:
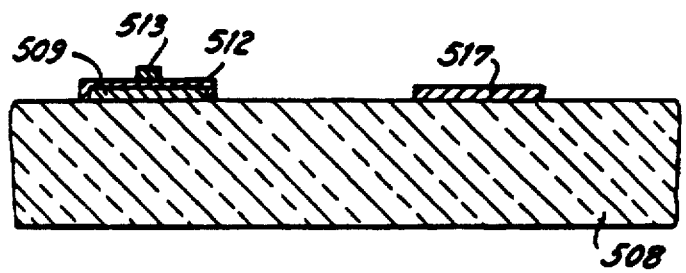
Figure 8C:
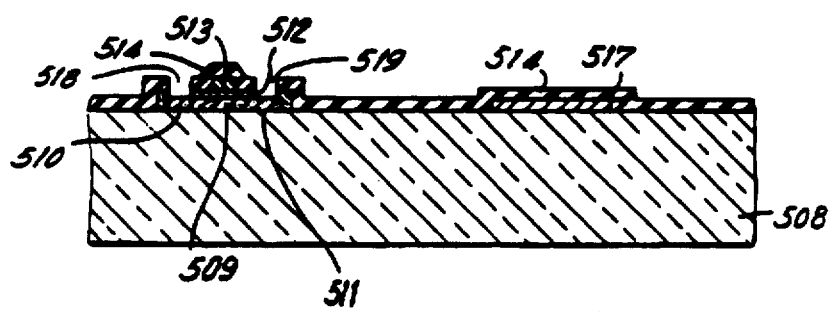
Figure 8D:
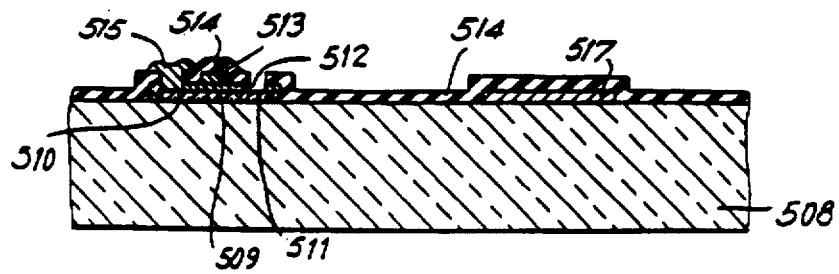
Figure 8E:
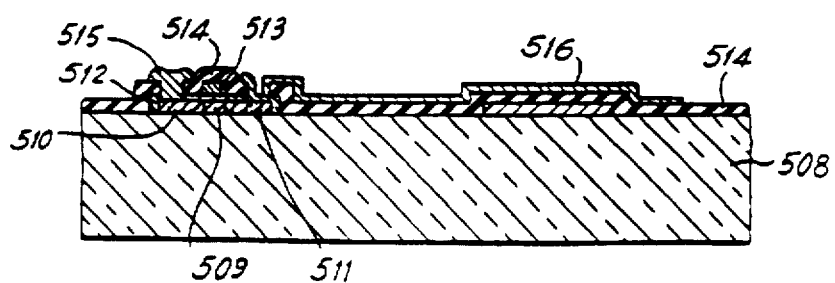

FIGS. 8a–e show the steps in manufacturing an active matrix substrate as shown in FIG. 7. An intrinsic polycrystalline silicon film 509 is deposited in the shape of an island on an insulating substrate 508 and a gate insulating film 512 is formed thereon by conventional methods, such as thermal oxidation, as shown in FIG. 8a. A gate electrode 513 and a common condenser electrode 517 which may be formed of the same conductive material at the same time, are formed as shown in FIG. 8b. Subsequently, impurities are doped to form source and drain regions 510 and 511. Thermal diffusion or ion implantation is generally used for doping impurities to the source and drain. An insulating layer 514 is formed across substrate 508 and contact holes 518 and 519 are opened in insulating layer 514 as shown in FIG. 8c. A data signal line 515 is deposited and is electrically connected to source or drain region 510 at contact hole 518, as shown in FIG. 8d. A driving electrode 516 is deposited on insulating film 514 and is electrically connected to drain or source region 511 at contact hole 519, as shown in FIG. 8e. In an alternative embodiment of the invention, signal line 515 is formed after driving electrode 516 is formed.

A unique characteristic of active matrix panels according to the embodiments in FIGS. 7 and 8a–8e is that intrinsic polycrystalline silicon film is used for the channel regions 409, 509 and the films formed by thermally oxidizing this intrinsic polycrystalline silicon is used as gate insulating films 412, 512.

The use of intrinsic polycrystalline silicon film for channel regions 409 and 509 allows a large amount of ON current to flow and simultaneously limits OFF current to a minimum. ON current flows in an amount sufficient for the active matrix substrate since polycrystalline silicon has a large carrier mobility of about 10 $cm^2$/Vsec. In addition, the OFF current can be limited to a minimum by using intrinsic polycrystalline silicon in the channel without any impurities and, preferably of a thickness of less than about 2500 Å.

Figure 9:
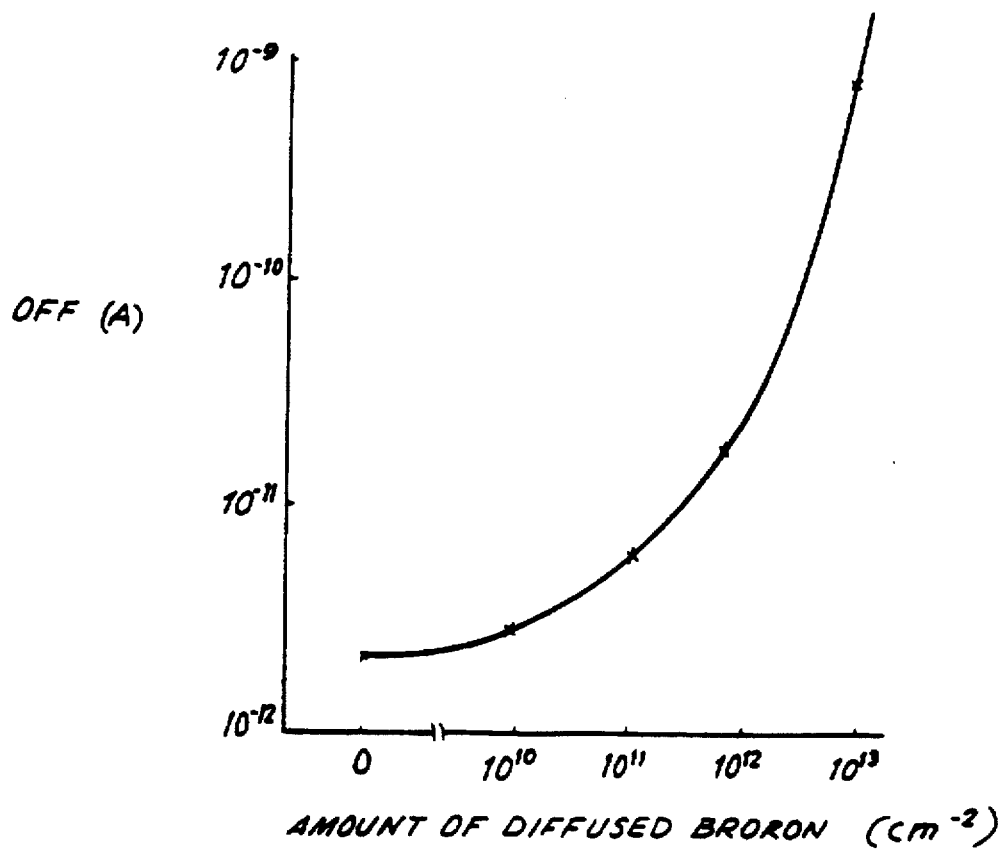
FIG. 9 is a graph illustrating the relationship between the concentration of impurities diffused into a channel region and the leakage current in an N-channel thin film transistor according to an embodiment of the invention.

FIG. 9 shows the relationship between the concentration of impurities diffused to the channel region in an N-channel thin film transistor according to the invention and the OFF current. Boron is used as the impurity, and is diffused by ion implantation so as to form a P-type channel region. The abscissa represents the amount of diffused boron, and the ordinate represents the amount of OFF current in the case of null (0) gate voltage.

The curve in FIG. 9 shows that the OFF current is a minimum in the case of non-diffused boron, namely, when utilizing intrinsic polycrystalline silicon. This is due to the leakage current in the PN junction which increases as the concentration of impurities becomes higher. In contrast, in an N-type channel region, a depletion-type transistor is formed and OFF current increases. Accordingly, the OFF current can be kept to a minimum value by utilizing intrinsic polycrystalline silicon.

Thermal oxidation of intrinsic polycrystalline silicon yields a gate insulating film permitting a large amount of ON current flow in the transistor. A superior thin film transistor is thereby provided, fulfilling the requirements of stability, reproducibility and reliability. Polycrystalline silicon needs to be thermally treated at temperatures higher than 900° C. for thermal-oxidation. At these temperatures the grain size of crystalline particles becomes larger and mobility greatly increases. As is well-known, in the case of forming gate insulating film by thermal oxidation of polysilicon, the interfacial surface between the polycrystalline silicon and its thermal oxidation film can be reduced to a smaller value compared with the cases of externally formed $SiO_2$ film, e.g., by sputtering, vapor phase growth and the like. Thus, the threshold voltage of the transistor can be lowered. Therefore, large amounts of ON current flow can be attained by utilizing intrinsic polycrystalline silicon having a large mobility and a low threshold voltage as the channel.

Furthermore, superior stability, reproducibility and reliability can be provided by thermally oxidizing the polycrystalline silicon to form the gate insulating film. A superior interface, usually having a small value of interfacial level can be stably formed so that stability, reliability and reproducibility of the transistor are greatly improved. The interface is formed utilizing stable materials such as silicon and the thermal oxidation film by the same process as that used in ordinary silicon technology.

As described above, this embodiment of the invention provides an improved active matrix substrate including a superior quality thin film transistor. Thermal treatment of the polycrystalline silicon at temperatures higher than 900° C. is required to form the gate insulating film. This requires an insulating substrate having a higher melting point than the thermal treatment temperatures, such as quartz glass, for example. This increases the cost of manufacturing an active matrix substrate, since a high-melt temperature substrate such as quartz is more expensive than a low-melt temperature substrate. Thus, it is preferred to reduce other expenses of manufacture. This embodiment of the invention provides a simplified construction of an active matrix substrate by forming a data signal line and a driving electrode with the same transparent conductive film as shown in FIG. 10.

Figure 10:
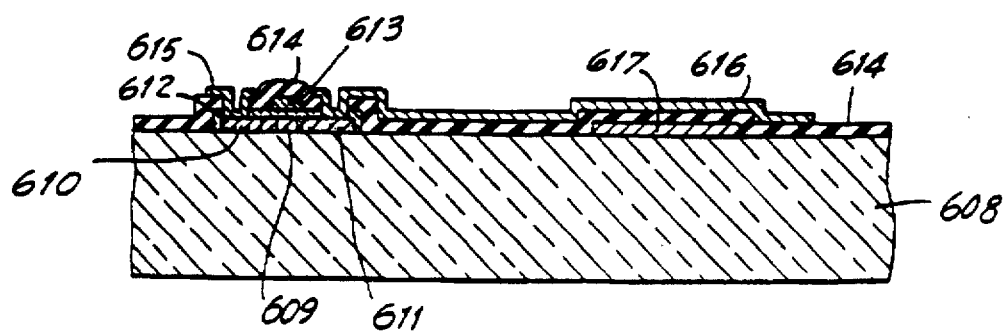
FIG. 10 is a cross-sectional view of one substrate of an active matrix assembly prepared in accordance with another embodiment of the invention.

FIG. 10 shows the construction of an active matrix substrate wherein a data signal line 615 and a driving electrode 616 are formed with the same transparent conductive film. The fundamental construction except for data signal line 615 and driving electrode 616 is the same as that shown in FIG. 7, and all other elements are identified by corresponding reference numerals. Indium oxide, tin oxide or indium tin oxide is preferably used for the transparent conductive film. The process step (d) shown in FIG. 8(d) wherein data signal line 515 is formed separately can be omitted in this construction.

An effective way to reduce manufacturing costs is to simplify the patterning process, since the patterning process (photo-etching process) accounts for a large percentage of manufacturing cost of the semiconductor device. Five separate patterning processing steps are required in the manufacturing process shown in FIGS. 8a–8e, whereas, only four separate patterning processes are utilized to prepare an active substrate as shown in FIG. 10. In addition, it is unnecessary to coat with two kinds of conductive films. Such a simplification of manufacturing process is extremely effective to form an inexpensive active matrix substrate.

Thus, in accordance with the invention, the advantageous characteristics of a thin film transistor are improved by sharply controlling the ON current and leakage current during the OFF state of the TFT by providing a thin film channel upon having a thickness less than about 2500 Å preferably less than 1000 Å but greater than 100 Å. Additionally, sufficient current in the ON state can flow into a liquid crystal electrode through the TFT. Construction of a TFT in accordance with the invention provides stable and reliable characteristics which are readily reproducible and suitable for long term use.

While the invention has been particularly shown and described with reference to preferred embodiments thereof, it will be understood by those skilled in the art that the foregoing and other changes in form and detail may be made therein without departing from the spirit and scope of the invention.

It is also to be understood that the following claims are intended to cover all of the generic and specific features of the invention herein described and all statements of the scope of the invention which, as a matter of language, might be said to fall therebetween.

What is claimed is:

1. A field effect transistor arranged over a substrate comprising:

a channel region disposed over the substrate, the channel region comprising a polycrystalline silicon layer having a thickness of less than 2500 Å;

a source region and a drain region spaced apart by the channel region;

a gate insulating film disposed on the channel region, the source region and the drain region;

a gate electrode disposed on the gate insulating film and opposing the channel region;

an interlayer disposed over the source region, the drain region and the gate electrode; and a source electrode and a drain electrode connected to connecting portions of the source region and the drain region through contact holes formed in the gate insulating film and the interlayer, at least one of the connecting portions of the source region and the drain region having a thickness greater than a thickness of the channel region.

2. The field effect transistor of claim 1, wherein the source electrode and the drain electrode comprise aluminum.

3. The field effect transistor of claim 1, wherein the thickness of the channel region is between about 100 Å and 1000 Å.

4. The field effect transistor of claim 1, wherein the thickness of the channel region is between about 100 Å and 2500 Å.

5. A liquid crystal device wherein data signals are supplied to liquid crystal cells through a plurality of field effect transistors arranged in a plurality of picture elements, each of said field effect transistors comprising:

a channel region disposed over a substrate, the channel region comprising a polycrystalline silicon layer having a thickness less than 2500 Å;

a source region and a drain region spaced apart by the channel region;

a gate insulating film disposed on the channel region, the source region and the drain region;

a gate electrode disposed on the gate insulating film and opposing the channel region;

an interlayer disposed over the source region, the drain region and the gate electrode; and a source electrode and a drain electrode connected to connecting portions of the source region and the drain region through contact holes formed in the gate insulating film and the interlayer, at least one of the connecting portions of the source region and the drain region having a thickness greater than a thickness of the channel region.

6. The liquid crystal device of claim 5, wherein the source electrode and the drain electrode comprise aluminum.

7. The liquid crystal device of claim 5, wherein a thickness of the channel region is between about 100 Å and 1000 Å.

8. The liquid crystal device of claim 5, wherein a thickness of the channel region is between about 100 Å and 2500 Å.

* * * * *